United States Patent [19]
Plumton et al.

[11] Patent Number: 5,889,298
[45] Date of Patent: Mar. 30, 1999

[54] VERTICAL JFET FIELD EFFECT TRANSISTOR

[75] Inventors: Donald Lynn Plumton; Han-Tzong Yuan, both of Dallas, Tex.

[73] Assignee: Texas Instruments Incorporated, Dallas, Tex.

[21] Appl. No.: 56,681

[22] Filed: Apr. 30, 1993

[51] Int. Cl.$^6$ ........................................ H01L 29/808
[52] U.S. Cl. .................. 257/285; 257/266; 257/287; 257/279; 257/263
[58] Field of Search .................... 257/287, 279, 257/285, 263, 266

[56] References Cited

U.S. PATENT DOCUMENTS

| | | | |
|---|---|---|---|
| 4,470,059 | 9/1984 | Nishizawa et al. | 257/279 |
| 4,498,093 | 2/1985 | Allyn et al. | 257/287 |
| 4,528,745 | 7/1985 | Muraoka et al. | 257/285 |
| 4,654,679 | 3/1987 | Muraoka | 257/266 |
| 4,712,122 | 12/1987 | Nishizawa et al. | 257/266 |
| 5,168,070 | 12/1992 | Lüth | 257/423 |

*Primary Examiner*—John Guay
*Attorney, Agent, or Firm*—Carlton H. Hoel; W. James Brady; Richard L. Donaldson

[57] ABSTRACT

A vertical field effect transistor (700) and fabrication method with buried gates (704) having gate sidewall crystal orientation the same as the substrate surface and a low index substrate crystal orientation without tilt to a higher index direction. The gate (704) may have modulated doping along the channel (706), and the drain (708) may have a lighter doping level than the channel which may be accomplished by an epitaxial overgrowth of the gates (704) to form the channels (706).

15 Claims, 10 Drawing Sheets

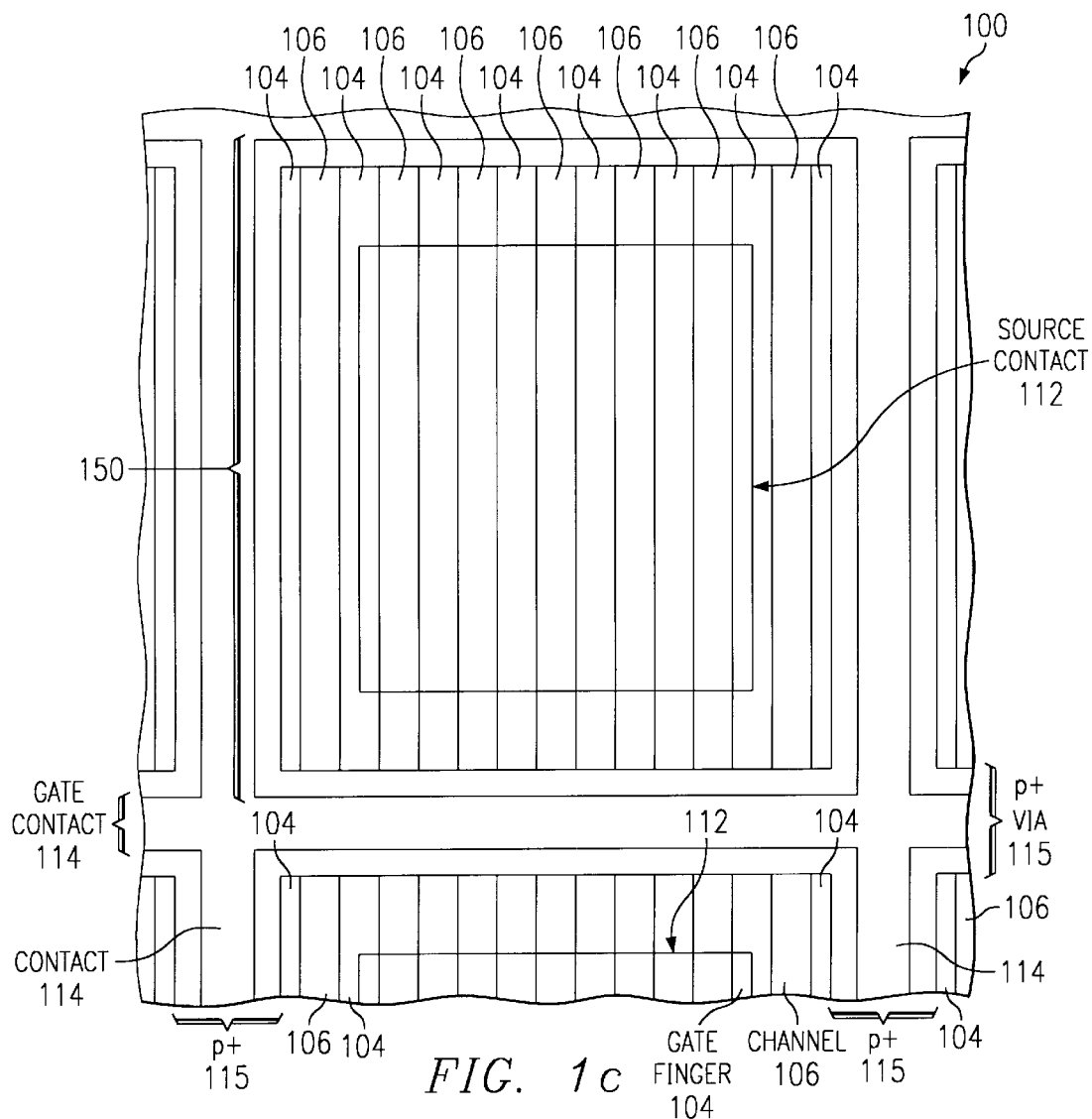
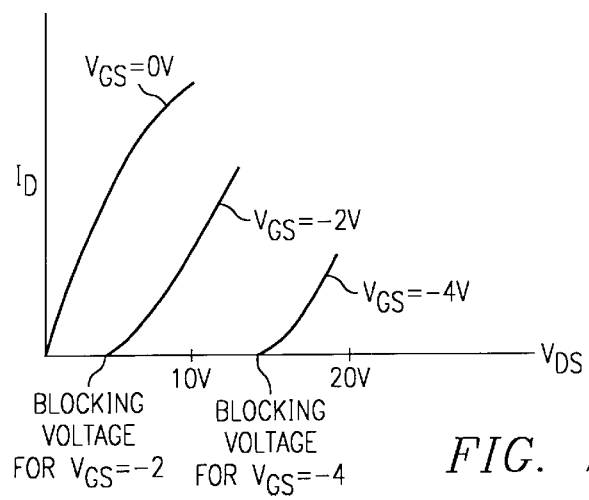

VERTICAL JFET FIELD EFFECT TRANSISTOR

GOVERNMENT CONTRACT

This invention was made with Government support under Contract No. N66001-91-C-6008 awarded by the Department of the Navy. The Government has certain rights in this invention.

CROSS-REFERENCE TO RELATED APPLICATIONS

The following applications contain subject matter related to the present application and are assigned to the assignee of the present application: application Ser. No. 07/876,252, filed Apr. 30, 1992, application Ser. No. 08/036,584, filed Mar. 24, 1993. and cofiled applications with Ser. Nos. 08/055,421, 08/056,682, and 08/056,004, now U.S. Pat. No. 5,712,189.

BACKGROUND OF THE INVENTION

The invention relates to electronic semiconductor devices and circuits, and, more particularly, to vertical field effect transistors and methods of fabrication.

Various semiconductor device types have been used for power handling: junction field effect transistors (JFETs), field-controlled diodes, power metal oxide-semiconductor field effect transistors (power MOSFETs), bipolar transistors, MOS gated thyristors, and insulated gate transistor (IGT). See Baliga, Modern Power Devices ch.4 (Wiley-Interscience 1987). Power devices ideally have low forward voltage drop, high switching speed, and low control power consumption; and the vertical field effect transistors (VFET) can provide these requirements. See Sze, Physics of Semiconductor Devices p.357 (Wiley-Interscience, 2d Ed., 1981) and Campbell et al, 150 Volt Vertical Channel GaAs FET, IEDM Tech. Dig. p.258 (1982). These references show a device with parallel buried p+ gate fingers and vertical carrier flow through n type channels between the gate fingers; the bias of the gate modulates the current flow. Increased power handling may conveniently be achieved with multichannel devices. These devices may operate with unsaturated current-voltage (I-V) characteristics. The use of gallium arsenide (GaAs) rather than silicon for the semiconductor material reduces the on-resistance of such VFETs due to the higher electron mobility. See Baliga, 40 IEEE Elec.Dev.Lett. 455 (1989) and Shenai et al, Optimum semiconductors for high-power electronics, 11 IEEE Elec.Dev.Lett. 520 (1990).

Variations of the vertical FET with recessed surface gates appear in Tantraporn et al, U.S. Pat. No. 4,129,879, Frensley et al, Design and Fabrication of a GaAs Vertical MESFET, 32 IEEE Tr.Elec.Dev. 952 (1985), Campbell et al, Trapezoidal-Groove Schottky-Gate Vertical-Channel GaAs EFT (GaAs Static Induction Transistor), 6 IEEE Elec.Dev.Lett. 304 (1985), Mori et al, A High Voltage GaAs Power Static Induction Transistor, Extended Abstracts of the 19th Conference on Solid State Devices and Materials, Tokyo, 279 (1987), and Hong et al, . . . 29 Jap.J.Appl.Phys. L2427 (1990).

However, such VFETs have problems including difficulties of fabrication and enhancing performance.

SUMMARY OF THE INVENTION

The present invention provides a buried gate field effect transistor with a modulated gate doping to control channel electric fields and with channel and source doping levels greater than drain doping levels.

BRIEF DESCRIPTION OF THE DRAWINGS

The drawings are schematic for clarity.

FIGS. 1a–c are perspective and cross-sectional elevation and plan views of a first preferred embodiment vertical field effect transistor.

FIGS. 2a–c show electrical characteristics and behavior of the first preferred embodiment.

DESCRIPTION OF THE PREFERRED EMBODIMENTS

First preferred embodiment VFET

Figure 1A:
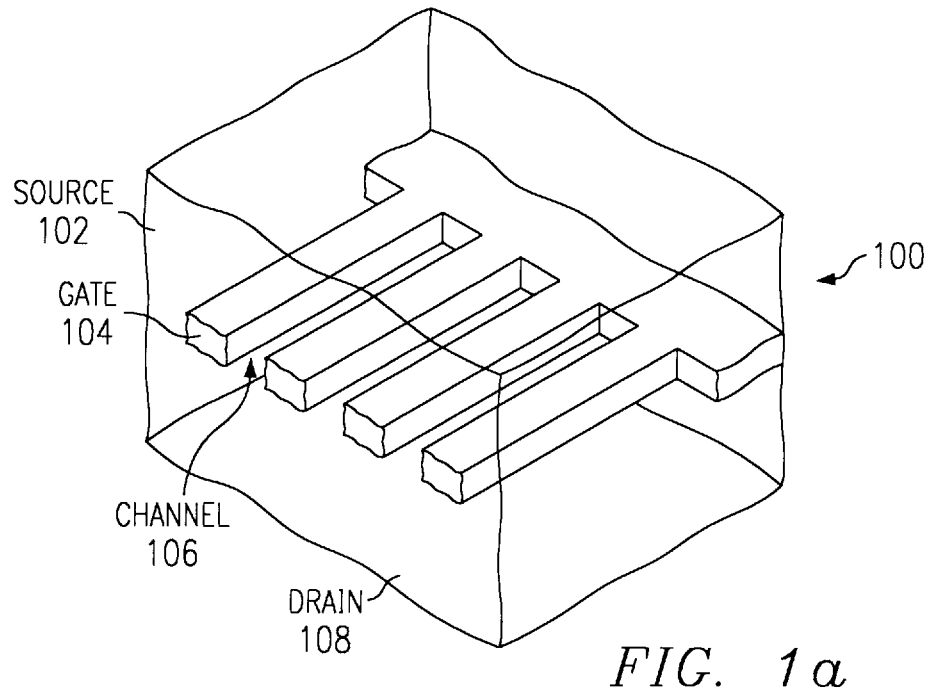
Figure 1B:
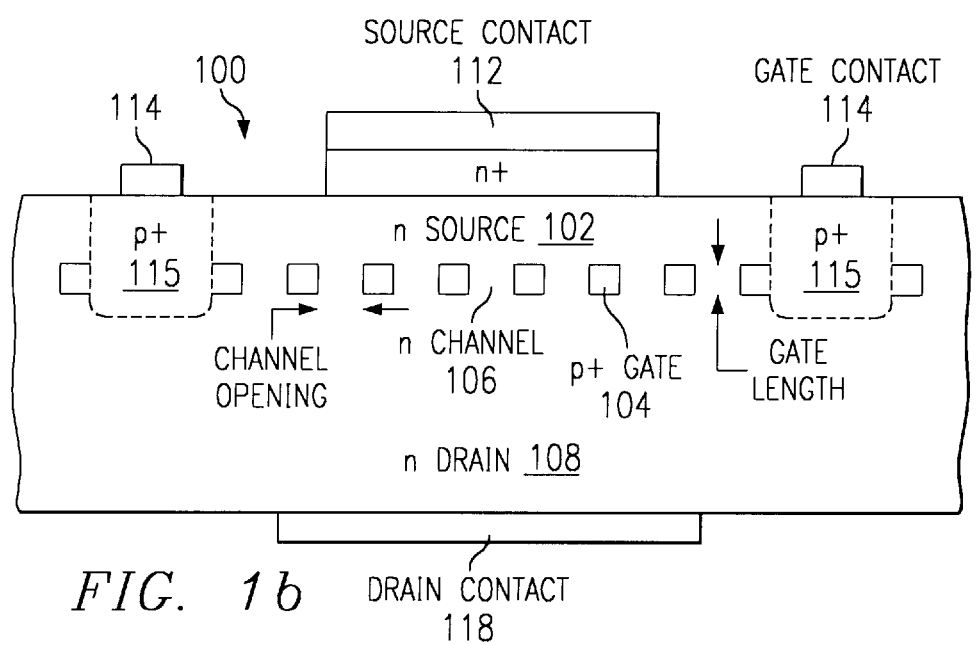

FIG. 1a shows in cutaway perspective view a first preferred embodiment vertical field effect transistor (VFET), generally denoted by the reference numeral 100, made of gallium arsenide (GaAs) and including n doped source 102, p+ doped gate 104 in the form of parallel fingers with n doped channel regions 106 between successive gate fingers, and n doped drain 108 which includes a drift region. FIG. 1b shows VFET 100 in cross sectional elevation view and also shows source contact 112, metal gate contact 114 which connects to gate 104 through p+ region 115, and bottom drain contact 118. FIG. 1c heuristically shows a plan view and indicates that the array of parallel gate fingers and channels can be repeated to increase total gate and channel width while retaining low gate resistance because of the gate metal around each repeated cell 150. Alternatively, the drain contact could be taken to the top surface analogous to the collector in a vertical bipolar transistor structure; this would also permit use of a high resistivity substrate and integration of other devices without a common drain. Note that for clarity FIGS. 1b–c show only seven channel regions 106 between adjacent parallel p+ regions 115; more typically there would be about 100–200 channel regions between adjacent parallel p+ regions, and the overall size of the rectangular areas surrounded by p+ 115 would be 100 $\mu$m by 200 $\mu$m. The use of metal gate contact 114 strapping the entire p+ region 115 lowers the gate resistance for high frequency operation.

VFET 100 has the structure of parallel junction field effect transistors (JFETs) with current flowing vertically in FIGS. 1a–b. With a positive voltage $V_{DS}$ applied from drain to source, majority carrier electrons flow from source 102 through channel regions 106 to drain 108; and a voltage $V_{GS}$ applied to gate 104 (reverse bias of the p-n junction) controls this flow by modulating the carrier levels in channel regions 106. The gate length equals the channel length plus the associated p-n depletion region and is the vertical distance indicated in FIG. 1b. The channel opening is the distance between adjacent gate fingers as shown in FIG. 1b. VFET 100 has a channel length of 0.3 μm and a channel opening of 0.5 μm with a channel doping concentration of $3 \times 10^{16}$ atoms/cm$^3$.

FIG. 2a illustrates the electrical characteristics of VFET 100. For $V_{GS}$ equal to 0, the depletion region of the p-n junction formed by gate 104 and channel 106 takes up about half of channel 106, and the drain current $I_D$ is proportional to $V_{DS}$ for small $V_{DS}$ and flows through the undepleted neutral central portion of channel 106. The ratio $I_D/V_{DS}$ is called the on-resistance $R_{ON}$ and depends upon the channel material, geometry, doping level, substrate resistance, and contact resistance. The channel material resistivity equals roughly 25 micro-ohm-cm$^2$ for VFET 100 while for the entire VFET it is roughly 50–100 micro-ohm-cm$^2$.

As $V_{GS}$ becomes negative and increases in magnitude, the neutral central channel portion begins to pinch off due to the reverse bias of the gate-channel junction, and the drain current pinches off. This represents the standard triodelike operation of a vertical JFET. Power switching applications only use turned-on and turned-off states of VFET 100. $V_{GS}=0$ (or $V_{GS}$ positive to forward bias the gate-channel junction for current injection) will turn on VFET 100 and $I_D$ will be large and $V_{DS}$ will be small; whereas, $V_{GS}$ large (negative) will turn off VFET 100 and $I_D$ will be a leakage current and $V_{DS}$ will be large. Thus the saturated current regime of pentodelike operation of a JFET will not typically be used.

Figures 2B, 2C:
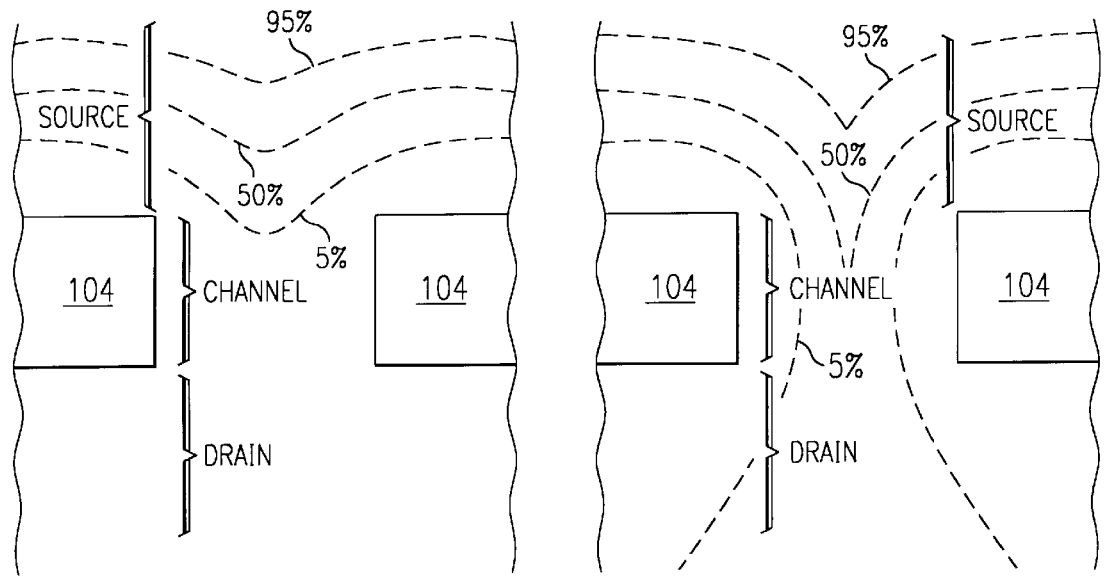

With $V_{GS}=-2$ volts the gate-channel junction depletion regions fill up channels 106 and this allows only leakage drain current $I_D$ until $V_{DS}$ reaches a certain minimum value (the blocking voltage). Further increases in $V_{DS}$ beyond the blocking voltge cause a rapid increase in drain current. The drain current follows a space charge limited dependence on $V_{DS}$ and thus VFET 100 exhibits triodelike operation. Increasing $|V_{GS}|$ increases the blocking voltage, and the ratio of blocking voltage to $|V_{GS}|$ is the DC blocking gain. VFET 100 has a DC blocking gain of roughly 3 to 20 for $V_{DS}$ in the range of 5 to 50 volts. Very high blocking voltages require long gates and large opening channels (large channel length to opening ratios) and reduced channel doping levels to limit the influence of $V_{DS}$ on the channel depletion regions and prevent the space charge limited current. Also high blocking voltages require large drains (drift regions) with low doping levels to support the large potential drop without avalanche breakdown. FIGS. 2b–c heuristically illustrate the channel carrier concentrations as a percentage of the undepleted channel carrier concentration for $V_{GS}$ equal to –3 volts and with $V_{DS}$ below the blocking voltage and above the blocking voltage, respectively.

VFET applications

Figure 3A:
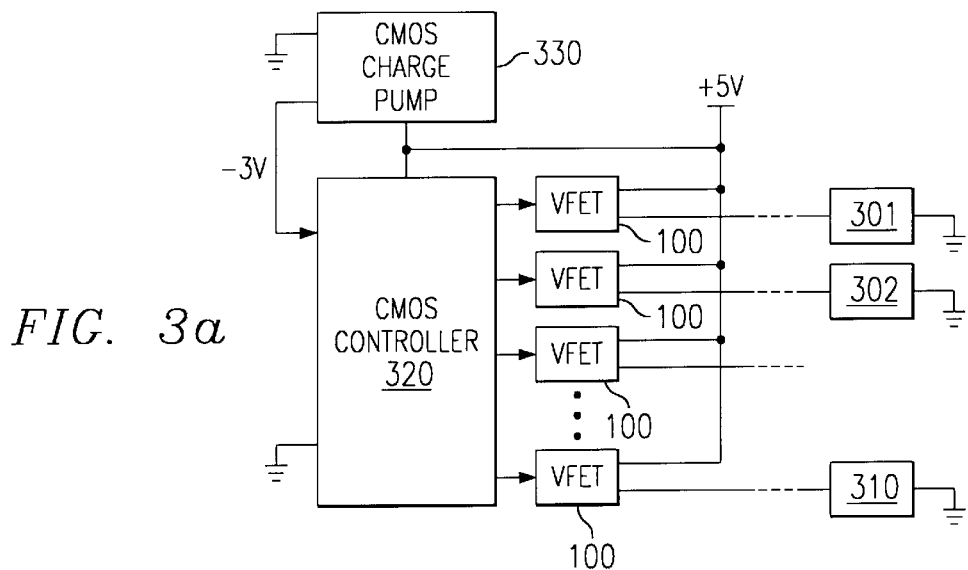
FIGS. 3a–d illustrate applications of the first preferred embodiment.

VFET 100 provides high frequency switching by low gate capacitance and low gate resistance through high gate doping levels and low channel doping levels plus small gate dimensions. FIG. 3a heuristically shows multiple VFET 100s with their drains all connected to a power supply $V_{DD}$ at +5 volts, with their sources connected to various devices 301, 302, . . . 310, and with their gates driven by controller 320. Thus controller 320 controls the power supply to each of devices 301, 302, . . . 310. Because VFETs 100 require a negative gate voltage to turn off, controller 320 has charge pump 330 to provide –3 volts. Both controller 320 and charge pump 330 could be CMOS circuits. The arrangement of FIG. 3a could be employed in battery powered systems such as portable computers where the devices 301, 302, . . . 310 would be items such as disk drives, keyboards, screens, CPUs, modems, and so forth with controller software controlled and interrupt driven to turn off all items not in use but quickly turn on items upon demand for use. Such power management will extend the charge life of a battery operating the portable computer, and the low voltage levels (e.g., down to 3.3 or even 1.5 volts) require a low $R_{ON}$ plus the high CPU frequencies (50 MHz) require rapid power switching.

Figure 3B:
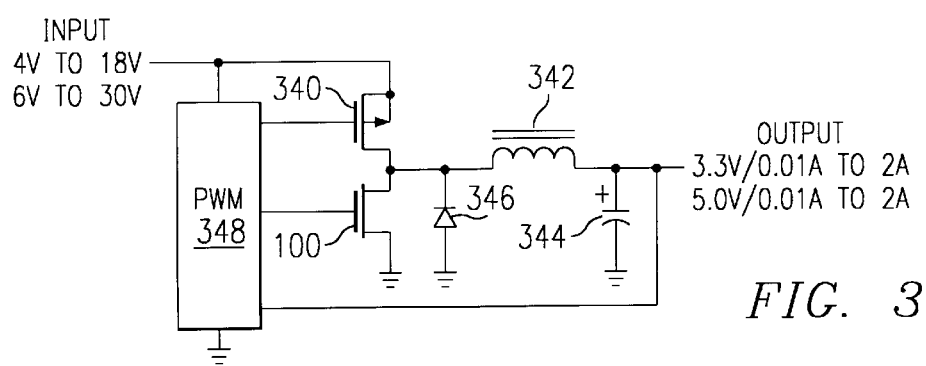

FIG. 3b shows a preferred embodiment switching voltage regulator including p-channel FET 340, lowpass filter made of inductor 342 and capacitor 344, free-wheeling diode 346, VFET 100, and pulse width modulator plus controller 348. This regulator has the "buck" topology and basically operates as follows. Controller 348 switches FET 340 at a fixed frequency (e.g., 100 KHz) and senses the output voltage to control the duty cycle of the switching of FET 340; this feedback sets the output DC voltage. The lowpass filter filters the resulting square wave from FET 340 to produce a ripple free DC output. Controller 348 includes a charge pump to generate negative gate voltage for VFET 100 and turns on VFET 100 when FET 340 is turned off; thus VFET 100 provides a low resistance path to ground and prevents the output node of FET 340 from going negative during the portion of the switching cycle in which FET 340 is turned off. Free-wheeling diode 346 parallels VFET 100 and provides the same function; however, free-wheeling diode 346 would cause a diode voltage drop, and without VFET 100 the average output DC current would pass through free-wheeling diode to cause power losses. VFET 100 provides a lower resistance path for the average DC current and eliminates the diode voltage drop and its attendant power losses.

Figure 3C:
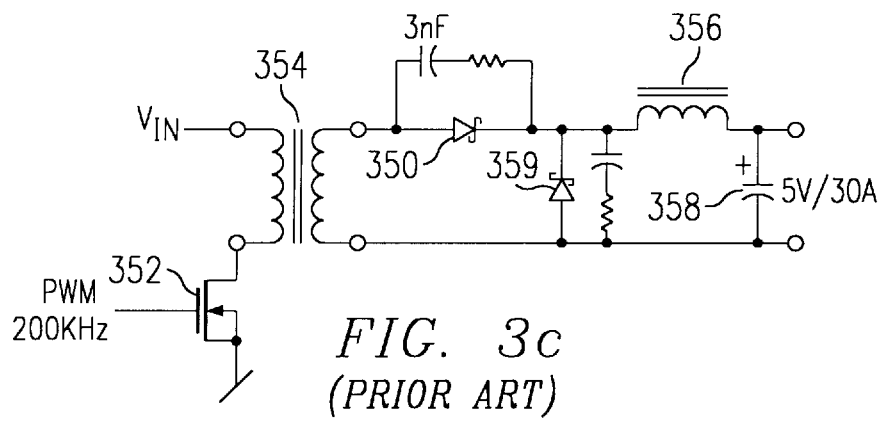
Figure 3D:
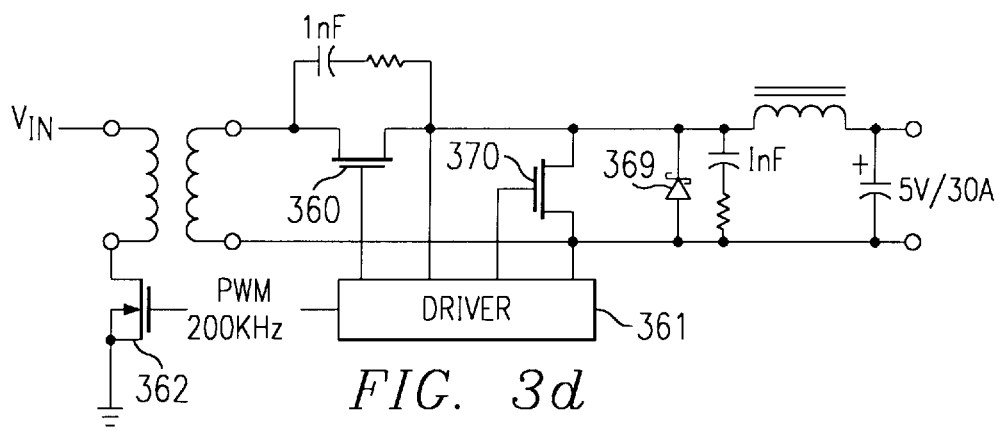

FIG. 3c illustrates a known DC-DC converter including a Schottky diode 350 for rectification. The converter operates in somewhat the same manner as the regulator of FIG. 3b: a pulse width modulator switches n-channel FET 352, and transformer 354 steps up (or down) the voltage of the resulting square wave. The lowpass filter made of inductor 356 and capacitor 358 filters the rectified square wave, and free-wheeling diode 359 prevents an overly negative filter input node. FIG. 3d shows a preferred embodiment DC-DC conveter with synchronous rectification by VFET 360 driven by driver 361 to be synchronized with the switching of FET 362 and with VFET 370 parallel free-wheeling diode 369. The converter of FIG. 3d operates analogous to the converter of FIG. 3c but with rectifying diode 350 replaced by the synchronous VFET 360 to avoid the diode voltage drop and attendant power losses and also with VFET 370 providing a low resistance path parallel free-wheeling diode 369 (analog of diode 359) to avoid its power losses.

First preferred embodiment method of fabrication

A preferred embodiment method of fabrication of VFET 100 for low voltage operation (a blocking voltage of 20 volts for a gate-to-source bias of –3 volts) uses a low resistivity substrate and backside drain contact and includes the following steps:

(a) Begin with a 25-mil thick (100)-oriented (to ±0.5°) GaAs wafer n++ doped with silicon to a level of about 2–4×10$^{18}$ atoms/cm$^3$. The substrate has true (100) orientation and does not have an orientation tilted 2° from (100) as is typically done to insure smoother epitaxial layer growth. Epitaxially grow by metalorganic chemical vapor deposition (MOCVD) the following layers of GaAs:

| Thickness | Doping type | Atomic concentration |
|---|---|---|
| 1.0 μm | n++ | 2 × 10$^{18}$/cm$^3$ |
| 1.0 μm | n– | 3 × 10$^{16}$/cm$^3$ |
| 0.3 μm | p++ | 1 × 10$^{20}$/cm$^3$ |

Figure 4A:
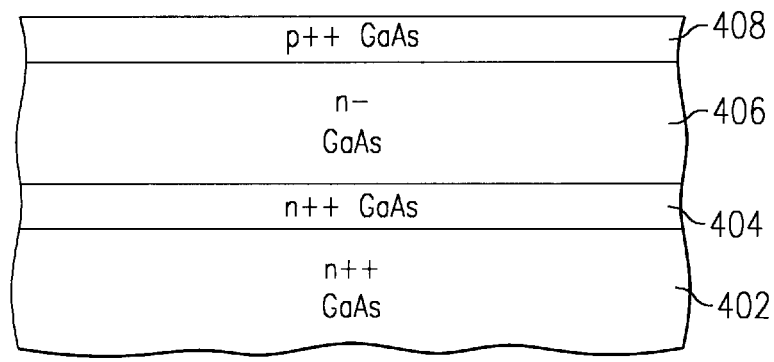
FIGS. 4a–d show steps in a first preferred embodiment method of fabrication.

The MOCVD uses trimethyl gallium (or equivalent such as triethyl gallium) and arsine (or equvalent such as tertiary-butyl arsine or trimethyl arsine) plus disilane (or equivalent) for n-type doping and CCl$_4$ (or equvalent) for p-type doping. See FIG. 4a for a cross sectional elevation view showing substrate 402, n++ epilayer 404, n– epilayer 406, and p++ gate layer 408.

Figure 4B:
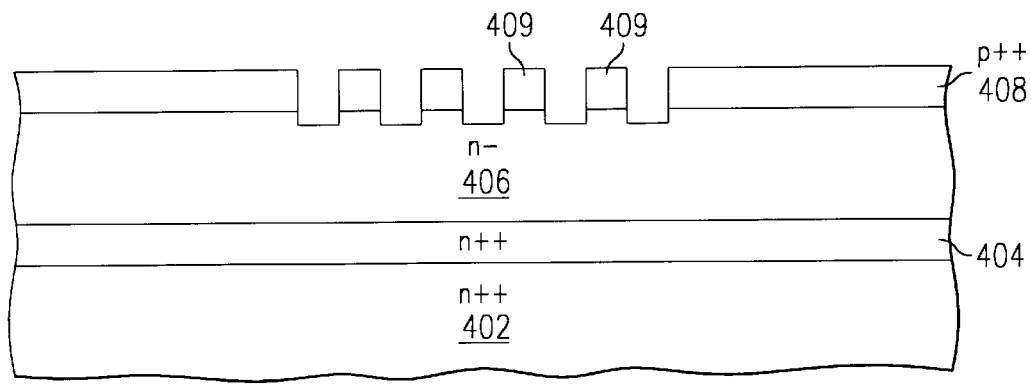
Figure 5A:
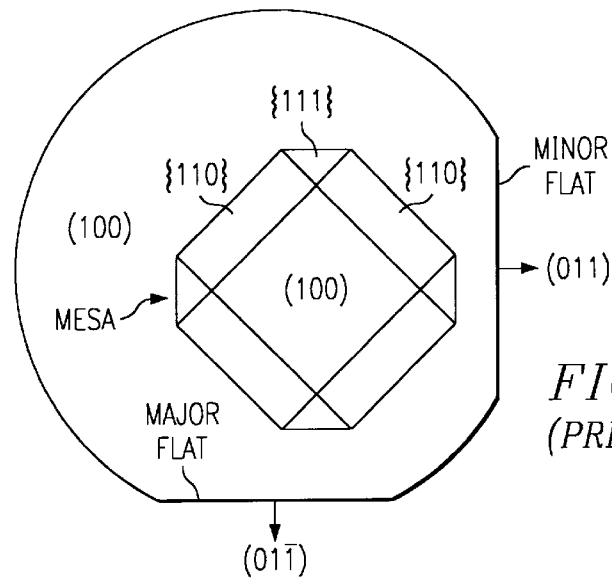
FIGS. 5a–c are plan views of semiconductor substrates illustrating a step of the preferred embodiment method of fabrication.
Figure 5B:
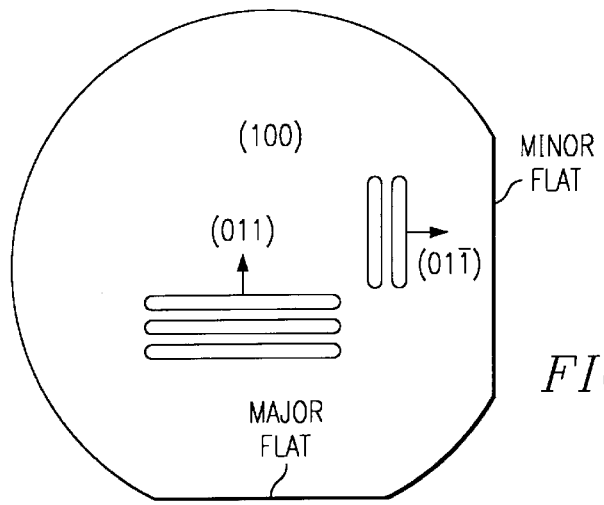

(b) Spin on photoresist and pattern it to define 50 gate fingers 409, and then etch with an electron cyclotron resonance (ECR) chlorine-based plasma etch using the patterned photoresist as the etch mask. See FIG. 4b; the channel regions between adjacent gate fingers 409 resemble a series of parallel slots in epilayer 408. The gate fingers are 0.3 μm long by 0.5 μm thick by 50–100 μm wide with 0.5 μm channel openings between adjacent gate fingers. The gate fingers all connect to the surrounding region in p++ layer 408. Overetching removes about 0.1 μm of n– layer 406. The preferred embodiment method of fabrication aligns the gate sidewalls with particular crystal planes; FIGS. 5a–b and the accompanying discussion details this alignment. The gate finger thickness minimum depends upon the resistivity of layer 408, and the channel region opening maximum derives from the gate bias for maximum blocking voltage plus the doping level of the channel region. A higher breakdown voltage (about 50 volts) version of VFET 100 would use 0.7 μm channel opening with a n– doping level of 1×10$^{16}$/cm$^3$. Note that locally trenches between gate fingers can also be viewed as gate finger pedestals on an underlying plane. A larger channel length would increase the blocking voltage up to breakdown limits. The channel length can be varied from 0.1 μm to greater than 1 μm.

Figure 4C:
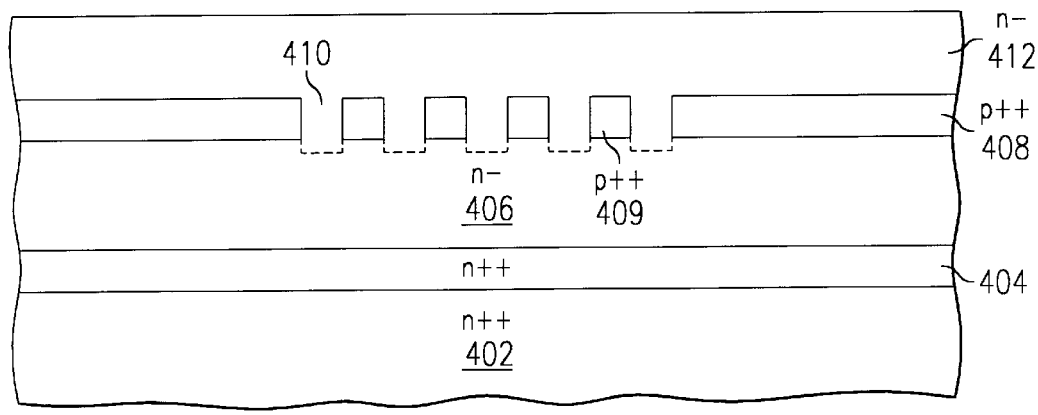
Figure 6A:
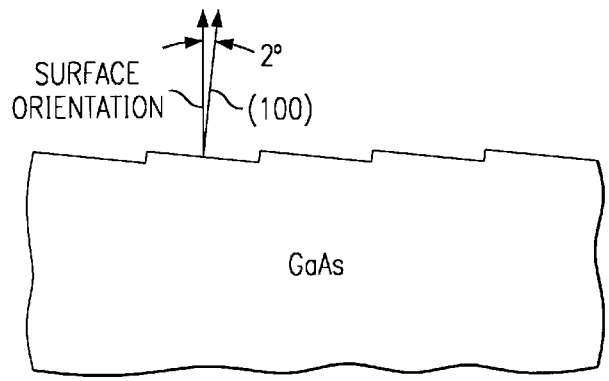
FIGS. 6a–b show oriented substrates and epitaxial growth.
Figure 6B:
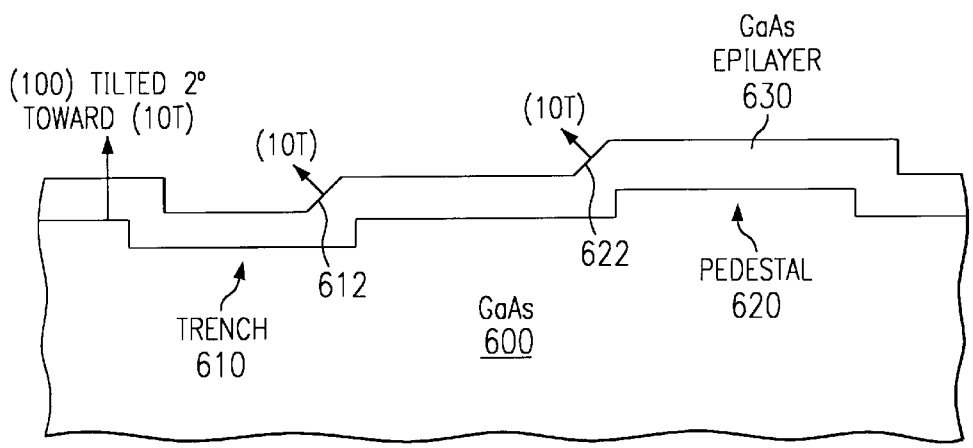

(c) Epitaxially grow an n– GaAs layer both to fill the spaces (channel regions 410) between the gate fingers and to continue to form source 412 of thickness 1.0 μm. The spaces between the gate fingers fill by growth both from the bottom of the spaces (layer 406) and from the vertical sidewalls. Of course, growth from the top of layer 408 occurs during this filling, and the pattern of the gate fingers is lost and the surface becomes essentially planar after about 0.5 μm due to the on-axis orientation. The epilayer has in situ doping with silicon to a level of 3×10$^{16}$ atoms/cm$^3$. See FIG. 4c. The lack of tilt in the orientation of substrate 402 affects the quality of the interface between the original gate sidewalls and the channel region filling newly grown GaAs material. FIGS. 6a–b and the accompanying discussion below indicate the tilt effect.

Figure 4D:
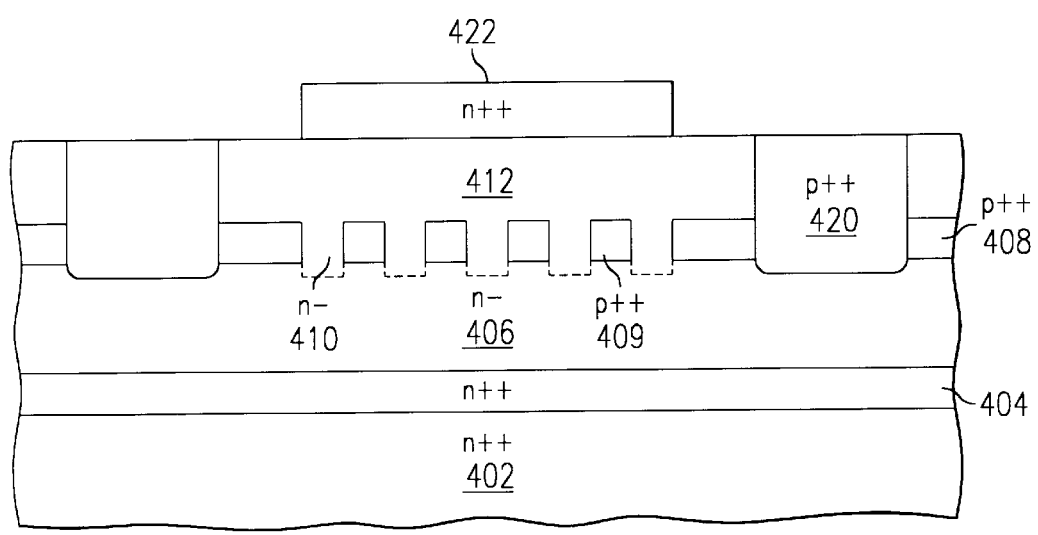

(d) Implant Be to make p++ connection 420 from etched p++ epilayer 408 to the surface of epilayer as shown in FIG. 1. (In place of the p++ implant a mesa etch down to layer 408 could be done.) Also, grow and pattern n++ epilayer 422 to make contact to n– source 412. Additional of metal contacts, encapsulation, and packaging completes a basic discrete VFET suitable for low voltage power regulation. FIG. 4d illustrates the essential structure. Metal contacts to the n+ GaAs for source and drain may be made of an alloy such as PdGeIn, AuGeNi, PdGe, TiPtAu (if layer 422 is n++ InGaAs), and so forth, and the p++ metal contact may be an alloy such as AuZn, AuBe, and AuMn.

Gate orientation

FIG. 5a shows a standard (100)-oriented GaAs wafer in plan view and illustrates the major and minor flats which are oriented 45° to the [010] and [001] directions and represent (011) and (01-1) oriented cleavage planes. An anisotropic wet etch such as H$_2$SO$_4$, H$_2$O$_2$, and H$_2$O in the ratio 1:8:40 preferentially does not etch (111)Ga planes. Thus a GaAs wafer subjected to an anisotropic wet etch with square etch mask leads to a raised mesa having face orientations as illustrated. Note that the wafer surface orientation tyically has a 2° tilt from precisely (100) for good growth of thick epilayers.

When gate layer 408 has gate fingers 409 formed as elongated regions parallel to either the major or minor flat of substrate 402 (see heuristic FIG. 5b in which the gate finger sidewalls are perpendicular to the plane of the Figure), then plasma etching yields gate sidewalls as {110} planes. These are the cleavage planes and the typical orientation. However, with this orientation for the gate finger sidewalls, the in situ doping MOCVD growth from the sidewalls incorporates the silicon dopants during growth of {110} or higher index planes and this leads to VFETs with poor performance which may be due to the silicon (which is an amphoteric dopant) also acting as an acceptor and yielding p type channel doping or the growth on {110} and higher index planes creating much higher crystal defect levels than growth on {110} planes. Such an incorrect doping or high defect levels in the portion of the channel abutting the gate smears out the p-n junction or provides leakage current paths and leads to poor depletion region control and low voltage gain (or low DC blocking voltage).

Figure 5C:
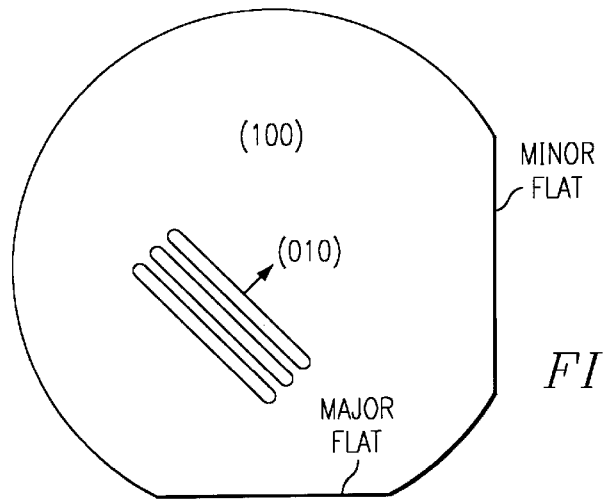

Preferred embodiment (010) or (001) orientation of the gate finger sidewalls as shown in FIG. 5c yields incorporation of the in situ silicon dopants during {100} plane growth and donor doping throughout the channel regions. In effect, the sidewalls have the same orientation as the original substrate. Of course, control of surface orientation to within 5° may be difficult for the sidewalls due to etch irregularities, but close to {100} will just be a tilted {100} plane and yield the proper donor silicon dopant incorporation.

Substrate tilt

FIG. 6a illustrates in cross sectional elevation view the typical 2° tilt of the (100) orientation with atomic level terracing of a GaAs substrate for epitaxial growth. The atomic level terracing promotes smooth epilayer growth on a planar surface, whereas epilayer growth on untilted (100) surfaces has less uniform nucleation and yields slight ripples on the order of a few hundred angstroms in height after 1–2 μm of epilayer growth. The surface roughness for precise (100) oriented GaAs surfaces increases with epilayer thickness up to about 5 μm and then appears to saturate. Note that a 2° tilt with a crystal unit cell dimension of about 5.65 Å yields terrace widths of roughly 100–200 Å.

However, for the growth in step (c) to fill the spaces between the gate fingers, the 2° tilt must be avoided. In fact, it has been found that epitaxial growth to fill trenches and overgrow pedestals on a 2° tilted (100) surface leads to facets as illustrated in cross sectional elevation view by FIG.

6b. In particular, 0.7 μm thick epilayer 630 grown on substrate 600 with 0.5 μm deep and 4 μm wide trench 610 and 0.5 μm high and 4 μm wide pedestal 620 (both having sidewalls with essentially (100) orientation as described in the preceding section) led to ledge 612 in trench 610 and ledge 622 at pedestal 620. For a (100) oriented substrate with a surface orientation vector tilted in the (10-1) direction the ledges also have an orientation of (10-1). A ledge growth in the channel regions of a VFET leads to poor performance which may arise from crystal defects due to higher index plane growth (growth on the ledges) or incorrect dopant incorporation as described in the Sidewall orientation section. Also, alignment marks (trenches or pedestals) for aligning subsequent etch masks appear shifted in epilayer 630 due to the ledges, and this complicates the fabrication process.

Consequently, the preferred embodiment uses a precisely (100) oriented (within a tolerance of 0.5°) substrate to avoid the ledges during overgrowth. This provides uniform filing of the channel between the gate fingers and uniform doping type in the channel. The use of untilted (100) oriented substrates of the preferred embodiment also avoids alignment mark shifting.

Second preferred embodiment VFET

Figure 7:
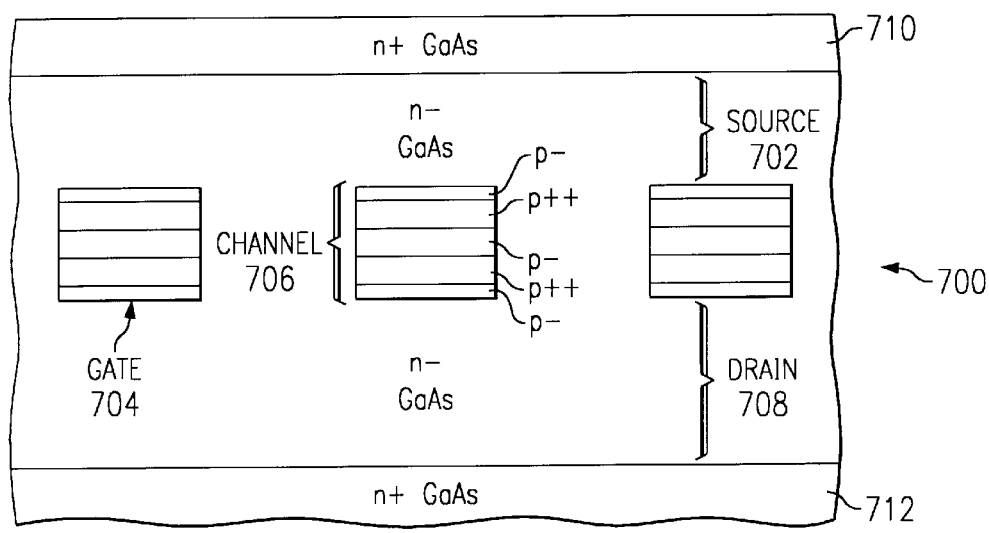
FIG. 7 illustrates in cross sectional view a second preferred embodiment.

FIG. 7 shows in cross sectional elevation view a second preferred embodiment VFET, generally denoted by the reference numeral 700, made of GaAs and including n doped source 702, p++/p− doped layered gate 704 in the form of parallel fingers with n doped channel regions 706 between successive gate fingers, n doped drain 708 including a drift region, n+ doped source contact 710 and n+ doped drain contact 712. VFET 700 resembles VFET 100 except for layered gate 704 which includes alternating layers of p++ and p− dopings. VFET 700 has the following dimensions: gate and channel region length 0.4 μm, gate finger breadth 0.5 μm, channel region opening 0.5 μm, source length 1 μm, and drain length 1 μm. The n− doping level of source 702, channel regions 706, and drain 708 is about $3\times10^{16}$ silicon atoms/cm$^3$. The carbon doping to make up gate 704 varies as follows with the 0.07 μm layer abutting the drain:

| Thickness | Doping type | Atomic concentration |
|---|---|---|
| 0.07 μm | p− | $1 \times 10^{14}$/cm$^3$ |
| 0.1 μm | p++ | $1 \times 10^{20}$/cm$^3$ |
| 0.1 μm | p− | $1 \times 10^{14}$/cm$^3$ |
| 0.1 μm | p++ | $1 \times 10^{20}$/cm$^3$ |
| 0.05 μm | p− | $1 \times 10^{14}$/cm$^3$ |

Carbon dopants have a very small diffusivity in GaAs, and thus such thin layers can be fabricated by MOCVD without the dopant diffusion overwhelming the layering even upon annealing.

Figure 8A:
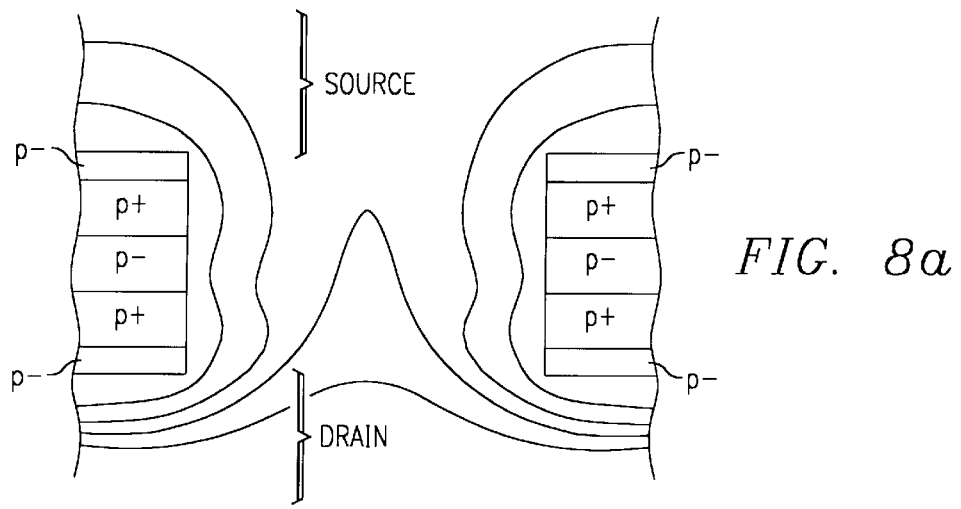
FIGS. 8a–b illustrate equipotentials of the second preferred embodiment.
Figure 8B:
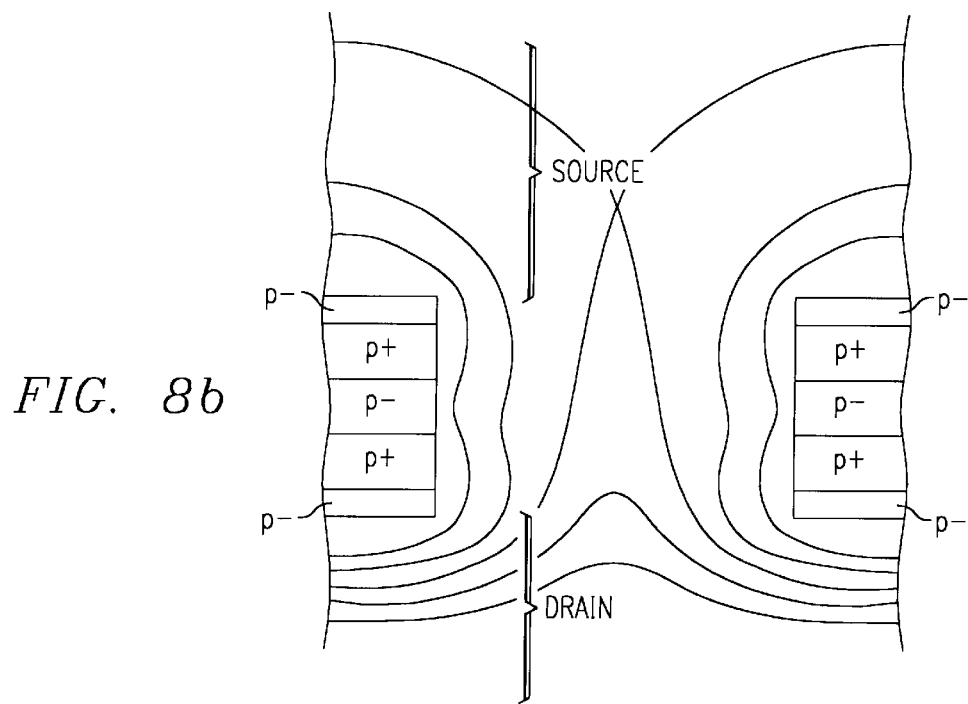

The layering of gate 704 along its length provides both low electric fields in channel regions 706 when no gate bias is applied (so the on-resistance $R_{ON}$ is low) and high electric fields with a reverse gate bias to have high blocking voltages and large blocking gain. FIGS. 8a–b heuristically illustrate the equipotential lines in the channel for −2 volt gate bias $V_{GS}$ with the drain to source voltage $V_{DS}$ just below blocking voltage in FIG. 8a and just above blocking voltage in FIG. 8b. The end p− layers reduce the corner electric field magnitude to increase the gate-to-drain breakdown voltage and reduce gate capacitance, and the middle p− layer flattens the equipotential surfaces in the channel regions and extends the high field saddle toward the drain. This flatter equipotential insures better drain potential blocking. Of course, the middle p− layer could be omitted for simpler fabrication and still retain the increase in breakdown voltage; or one or both of the end p− layers could be omitted and still retain the equipotential surface flattening.

Figure 9A:
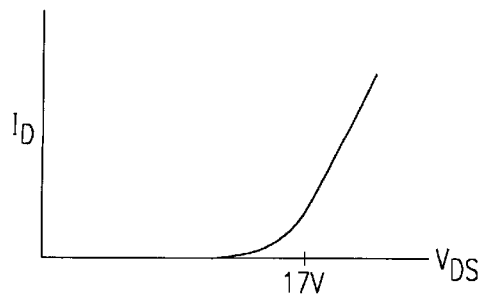
FIGS. 9a–b show electrical characteristics of the second preferred embodiment.
Figure 9B:
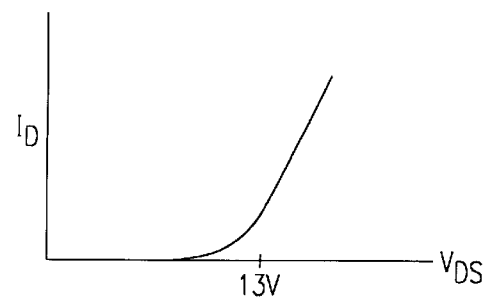

FIGS. 9a–b show the I-V characteristics for a gate bias of −2 volts; FIG. 9a for the VFET as shown in FIG. 7 and FIG. 9b for interchanged source and drain.

Gate 704 could include more layers, especially for longer gates, to further flatten the equipotential surfaces and improve the blocking voltage, but longer gates increase the on resistance $R_{ON}$. Additionally, the gate layers could be separated by an n− layer, and then individual contacts to the gate layers could create pentodelike characteristics for the VFET.

Furthermore, the layered gate could be used without the sidewall orientation or with a tilted substrate. Lastly, a gate with doping variation along its length could be used in horizontal field effect transistors. In such a horizontal case, a buried gate region could be a series of subregions with separate doping levels.

Third preferred embodiment VFET

Figure 10:
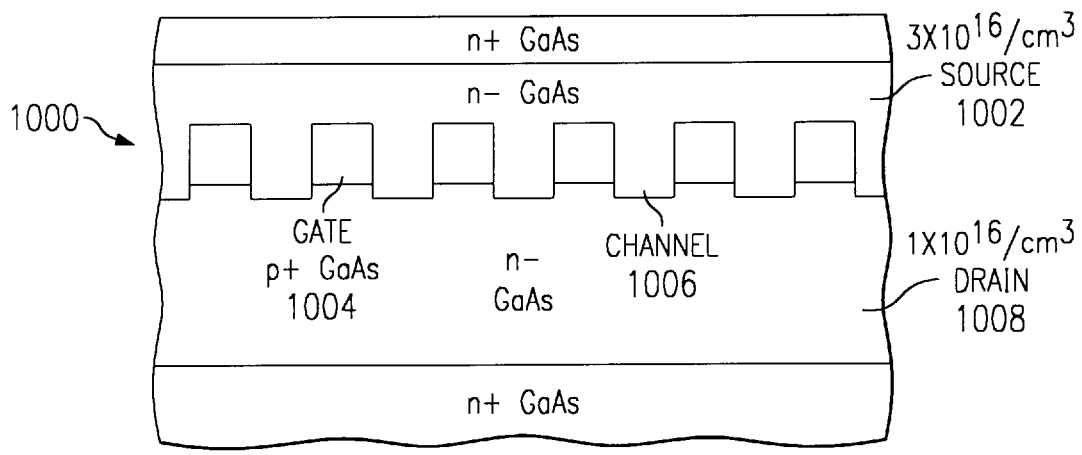
FIG. 10 is a cross sectional elevation view of a third preferred embodiment.

FIG. 10 shows in cross sectional elevation view a third preferred embodiment VFET, generally denoted by the reference numeral 1000, made of gallium arsenide (GaAs) and including n doped source 1002, p+ doped gate 1004 in the form of parallel fingers with n doped channel regions 1006 between successive gate fingers, and n doped drain 1008. VFET 1000 differs from VFET 100 with respect to source/drain doping levels; in particular, VFET 1000 has lighter drain doping, as follows.

| Region | Doping type | Atomic concentration |
|---|---|---|
| Source | n− | $3 \times 10^{16}$/cm$^3$ |
| Channel | n− | $3 \times 10^{16}$/cm$^3$ |
| Drain | n− | $1 \times 10^{16}$/cm$^3$ |

The lighter doping of drain 1008 leads to a higher gate/substrate breakdown voltge, reduced gate/substrate capacitance, and higher blocking voltage by effectively increasing the channel length in that the channel depletion region extends deeper into the drain. It also decreases the effect of drain-source voltage $V_{DS}$ changes on the gate blocking because the integrated charge is less on the substrate side. Further, a channel openning of 0.8 μm with a channel doping level of $1\times10^{16}$/cm$^3$ has about the same blocking voltage with the same gate voltage as a channel opening of 0.4 μm with a channel doping level of $3-4\times10^{16}$/cm$^3$; however, the smaller channel opening with higher channel doping leads to a lower on resistance $R_{ON}$. Thus the difference in channel and drain doping levels yields VFETs with better performance. The p+ gate layer 1004 can also have p− layers on both source and drain sides to minimize capacitance.

Fourth preferred embodiment VFET

Figure 11:
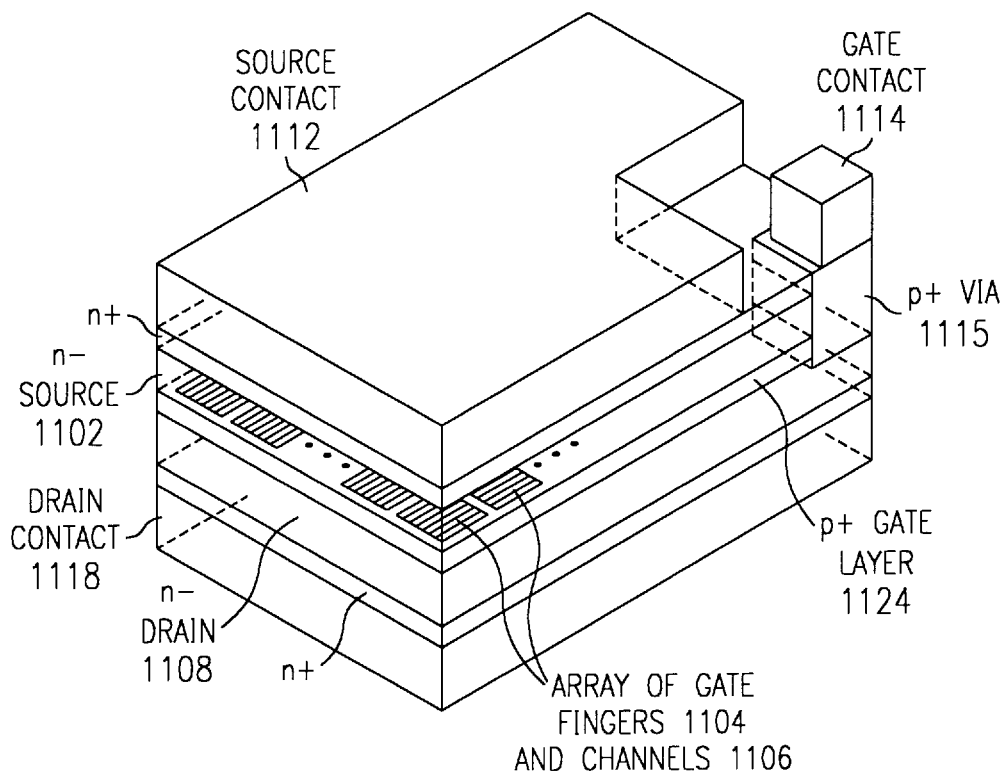
FIG. 11 is a perspective view of a fourth preferred embodiment.

A fourth preferred embodiment VFET combines the layered gate 704 of VFET 700 with the lightly doped drain 1002 of VFET 1000. And the fourth preferred embodiment VFET adpated for low frequency use may have the simpler layout shown in heuristic perspective view in FIG. 11. FIG. 11 shows p+ gate layer 1124 connected by a single doped via 1115 in a corner of the integrated circuit die to metal gate contact 1114 with all of the channels 1106 between gate fingers 1104 formed in layer 1124. The gate fingers are formed in repeated areas approximately 50 μm square which limits the gate finger width and gate resistance. The use of a single gate contact 1114 reduces the die area devoted to contacts and permits a maximal portion of gate layer 1124 to be patterned as gate fingers and channels.

Heterostructure VFET and HBT

Figure 12:
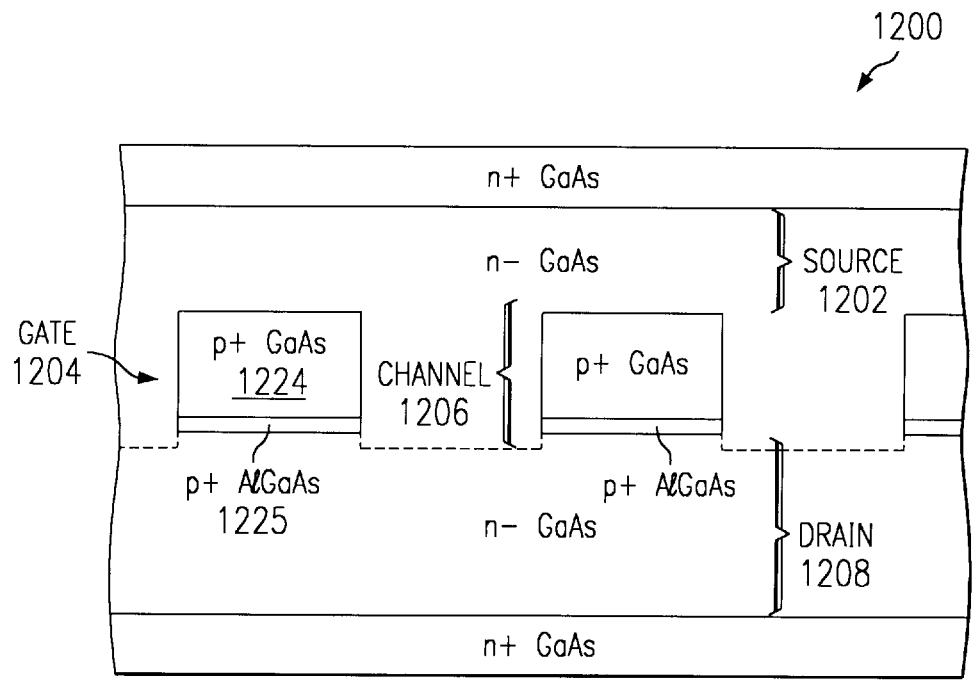
FIG. 12 illustrates in cross sectional view a fifth preferred embodiment.

FIG. 12 shows in cross sectional elevation view a portion of fifth preferred embodiment VFET 1200 which includes source 1202, gate fingers 1204, channels 1206, and drain 1208. All of these regions are made of GaAs except gate fingers 1204 are made of 0.3 μm thick p+ GaAs sublayer 1224 plus 0.05 μm thick p+ $Al_{0.3}Ga_{0.7}As$ sublayer 1225. The incorporation of sublayer 1225 provides a heterojunction from gate 1204 to drain 1208 and thereby increase gate-drain breakdown voltage and decrease leakage current.

Alternatively, gate 1204 could be entirely p+ $Al_{0.3}Ga_{0.7}As$ (0.3 μm thick) or be p+ $Al_{0.3}Ga_{0.7}As$ with a thin GaAs top sublayer to aid in the n– GaAs overgrowth forming source and channels. The $Al_{0.3}Ga_{0.7}As$ gate would also form a heterojunction with the channel and lessen gate-channel junction leakage.

Fabrication of VFET 1200 and variants proceeds as with VFET 100 with the addition of growth of a p+ $Al_{0.3}Ga_{0.7}As$ layer; the plasma etch to form the gate fingers also etches $Al_{0.3}Ga_{0.7}As$. Again, the fabrication process benefits from precise (100) orientation of the wafer and (010) and (001) orientation of the gate finger sidewalls. Of course, VFET 1200 could have modulated gate doping like VFET 700 and a lightly doped drain like VFET 1000.

Figure 13:
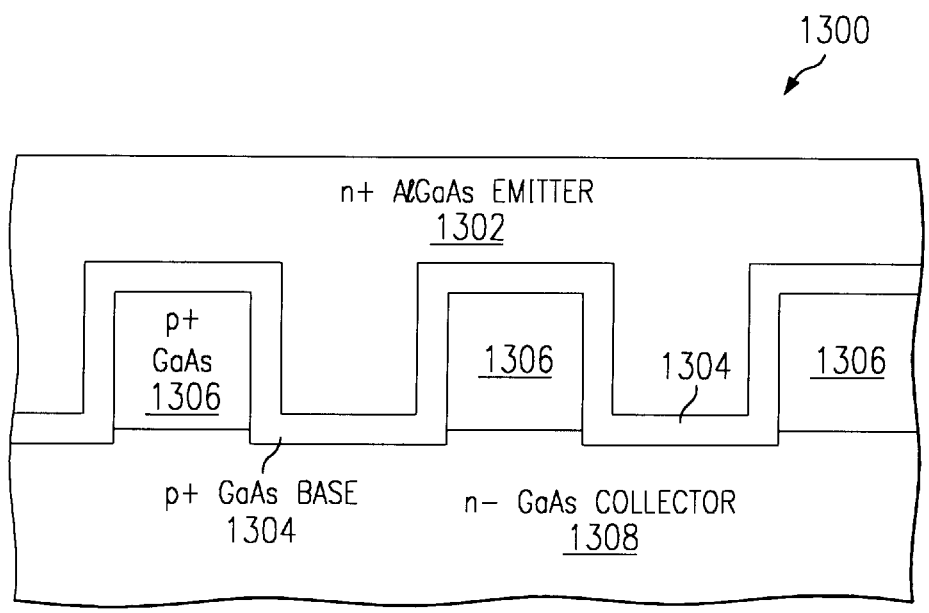
FIG. 13 shows in cross sectional view a sixth preferred embodiment.

FIG. 13 shows in cross sectional elevation view a portion of sixth preferred embodiment heterojunction bipolar transistor (HBT) 1300 which includes n+ $Al_{0.3}Ga_{0.7}As$ emitter 1302, p+ GaAs intrinsic base 1304, p+ extrinsic base 1306, and n– GaAs collector 1308. Extrinsic base 1306 has a finger structure analogous to gate fingers of VFET 100, although the number of fingers may be much smaller and the finger size larger. In particular, extrinsic base fingers 1306 could have a cross section of 2 μm by 2 μm to minimize the base resistance, whereas intrinsic base 1304 may have a thickness of 0.1 μm and a distance between adjacent extrinsic base fingers of 3 μm.

Fabrication of HBT 1300 may proceed analogous to that of VFET 100 but with the n– GaAs overgrowth forming the channels and source replaced by a 0.05 μm thick growth of p+ GaAs (in situ carbon doping) to form the intrinsic base and then a 0.5 to 1.0 μm thick n+ $Al_{0.3}Ga_{0.7}$ As (in situ silicon doping) growth to form the emitter. The p+ GaAs overgrowth to form the intrinsic base benefits from precise (100) orientation of the wafer to avoid any ledge beginning and the (010) and (001) orientation of the base finger sidewalls just replicates. The overgrowth of n+ $Al_{0.3}Ga_{0.7}As$ benefits from these orientations as did the n– GaAs in that the wafer orientation avoids the ledge formation and non-uniform fill of the emitter between the extrinsic base fingers and the extrinsic base sidewall orientation insures n type emitter doping. Note that silicon dopants have very small diffusivities in GaAs and $Al_{0.3}Ga_{0.7}As$, and thus using germanium or tin in place of silicon for the n type doping to deemphasize the base sidewall orientation will generate dopant diffusion problems.

Modifications and advantages

The preferred embodiments may be varied in many ways while retaining one or more of the features of overgrowth on vertical sidewalls with approximately the same crystal plane orientation as a substrate surface, overgrowth of trenches and pedestals in untilted substrates, VFET buried gate doping varying along the gate length, and varying VFET source/drain doping.

For example, the dimensions of the various components could be varied, the geometry of the channels in the VFETs or the emitters in the HBTs could be varied, other III–V materials such as GaP, InP, $Ga_xIn_{1-x}P$, $In_xGa_{1-x}As$, AlAs, $Al_xGa_{1-x}As$, and so forth also have the zinc blende crystal structure and overgrowth properites as GaAs. The GaAs may be an island of material grown in a recess in a silicon wafer. The p++ doping by Be to make connection to the buried gates may be replaced by Zn doping; in this case metal contacts may be alloys such as TiPtAu. Also, diamond and silicon carbide are possible materials for VFETs and HBTs.

The invention has the technical advantage of better channel field control in junction field effect transistors.

What is claimed is:

1. A field effect transistor, comprising:

(a) a source region in a semiconductor layer;

(b) a drain region in said semiconductor layer;

(c) a gate region in said semiconductor layer and between said source region and said drain region;

(d) a channel region in said semiconductor layer and between said source region and said drain region and abutting said gate region;

(d) wherein said gate region has a doping level where said gate region abuts said channel region varying in the direction from said source region to said drain region.

2. The transistor of claim 1, wherein:

(a) said gate region includes a first subregion abutting said drain and a second subregion away from said drain, wherein said first subregion has a doping level less than the doping level of said second subregion.

3. The transistor of claim 2, wherein:

(a) said layer is made of gallium arsenide;

(b) said gate region is doped p-type with carbon; and (c) said source, drain, and channel regions are doped n-type with silicon.

4. The transistor of claim 1, wherein:

(a) carrier flow from said source region, through said channel region, and into said drain region is substantially perpendicular to a surface of said semiconductor layer.

5. The transistor of claim 4, wherein:

(a) said gate region includes a plurality of parallel fingers with portions of said channel region between successive ones of said parallel fingers.

6. The transistor of claim 5, wherein:

(a) said layer is made of gallium arsenide;

(b) said gate region is doped p-type with carbon; and (c) said source, drain, and channel regions are doped n-type with silicon.

7. The transistor of claim 1, wherein:

(a) said gate region includes successive subregions $S_1, S_2, \ldots S_K$ in the direction from said drain to said source with K a positive integer greater than 2, wherein the doping level of $S_2$ differs from that of $S_1$ and the doping level of $S_{K-1}$ differs from than that of $S_K$.

8. The transistor of claim 7, wherein:

(a) K equals 3; and (b) the doping levels of $S_1$ and $S_3$ are equal and less than that of $S_2$.

9. The transistor of claim 7, wherein:

(a) $S_1$ and $S_3$ are doped more heavily than $S_2$.

10. The transistor of claim 7, wherein:
(a) K equals 5; and
(b) the doping levels of $S_1$, $S_3$, and $S_5$ are less than those of $S_2$ and $S_4$.

11. The transistor of claim 7, wherein:
(a) said layer is made of gallium arsenide;
(b) said gate region is doped p-type with carbon; and
(c) said source region, drain region, and channel region are doped with silicon.

12. The transistor of claim 7, wherein:
(a) carrier flow from said source region, through said channel region, and into said drain region is substantially perpendicular to a surface of said semiconductor layer.

13. The transistor of claim 12, wherein:
(a) said gate region includes a plurality of parallel fingers with portions of said channel region between successive ones of said parallel fingers.

14. The transistor of claim 7, wherein:
(a) the doping type of $S_j$, for a j greater than 1 and less than K, is opposite the doping type of $S_1$ and $S_K$, whereby said gate is split into two subgates.

15. The transistor of claim 7, wherein:
(a) $S_1$ is made of a first semiconductor material and $S_K$ is made of a second semiconductor material with a said first material having a larger bandgap than said second material.

* * * * *